United States Patent
Choi et al.

(10) Patent No.: US 7,596,021 B2
(45) Date of Patent: Sep. 29, 2009

(54) MEMORY SYSTEM INCLUDING MLC FLASH MEMORY

(75) Inventors: Jin-Hyeok Choi, Yongin-si (KR); Bong-Ryeol Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/764,594

(22) Filed: Jun. 18, 2007

(65) Prior Publication Data

US 2008/0192539 A1    Aug. 14, 2008

(30) Foreign Application Priority Data

Feb. 9, 2007  (KR) .................... 10-2007-0013896

(51) Int. Cl.
*G11C 16/04* (2006.01)
(52) U.S. Cl. .................... 365/185.03; 365/185.12; 365/189.05
(58) Field of Classification Search ............ 365/185.03, 365/185.33, 185.12, 185.17, 189.05
See application file for complete search history.

(56) References Cited

U.S. PATENT DOCUMENTS

| | | | | |
|---|---|---|---|---|
| 6,459,622 B1* | 10/2002 | Ogura et al. | ............ | 365/185.28 |
| 6,879,520 B2* | 4/2005 | Hosono et al. | ......... | 365/185.17 |
| 6,999,344 B2* | 2/2006 | Hosono et al. | ......... | 365/185.17 |
| 7,149,111 B2 | 12/2006 | Murin et al. | | |
| 7,206,224 B1* | 4/2007 | Randolph et al. | ...... | 365/185.03 |
| 7,227,785 B2* | 6/2007 | Lee et al. | ................ | 365/185.24 |
| 7,333,371 B2* | 2/2008 | Hosono | ................. | 365/189.05 |
| 7,489,547 B2* | 2/2009 | Moogat et al. | ......... | 365/185.17 |

FOREIGN PATENT DOCUMENTS

| | | |
|---|---|---|
| JP | 10-011983 | 1/1998 |
| JP | 2000-251484 | 9/2000 |
| JP | 2004-319007 | 11/2004 |
| JP | 2005-276407 | 10/2007 |
| KR | 1997-0029851 | 6/1997 |
| KR | 1999-0076163 | 10/1999 |
| KR | 1020020057055 | 7/2002 |
| KR | 1020050007653 | 1/2005 |

OTHER PUBLICATIONS

English Abstract for Publication No. 10-011983.
English Abstract for Publication No. 2000-251484.
English Abstract for Publication No. 1020020057055.
English Abstract for Publication No. 1020050007653.
English Abstract for Publication No. 2005-276407.
English Abstract for Publication No. 1997-0029851.
English Abstract for Publication No. 1999-0076163.
English Abstract for Publication No. 2004-319007.

* cited by examiner

*Primary Examiner*—Gene N. Auduong
(74) *Attorney, Agent, or Firm*—F. Chau & Associates, LLC

(57) ABSTRACT

A memory system includes a flash memory storing multi-bit data in one memory cell. A memory controller controls the flash memory to program the multi-bit data in the memory cell. The flash memory programs the multi-bit data in the memory cell in a single program operation.

11 Claims, 7 Drawing Sheets

Fig. 2
(PRIOR ART)
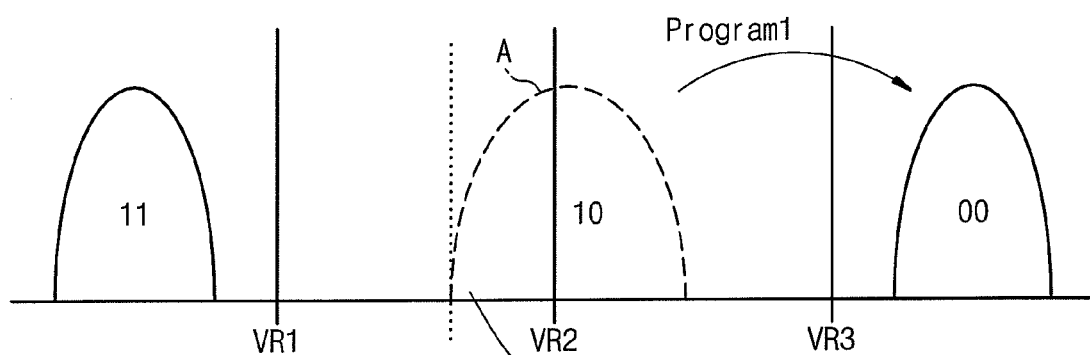
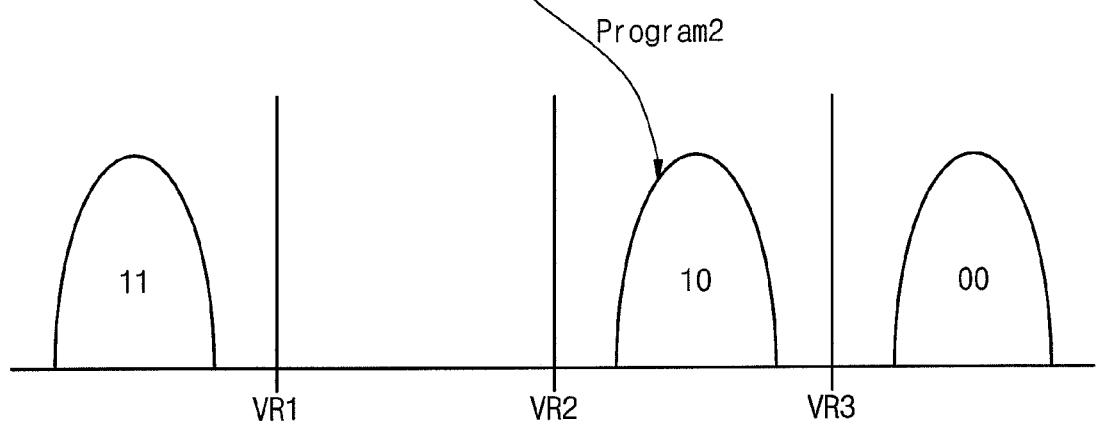
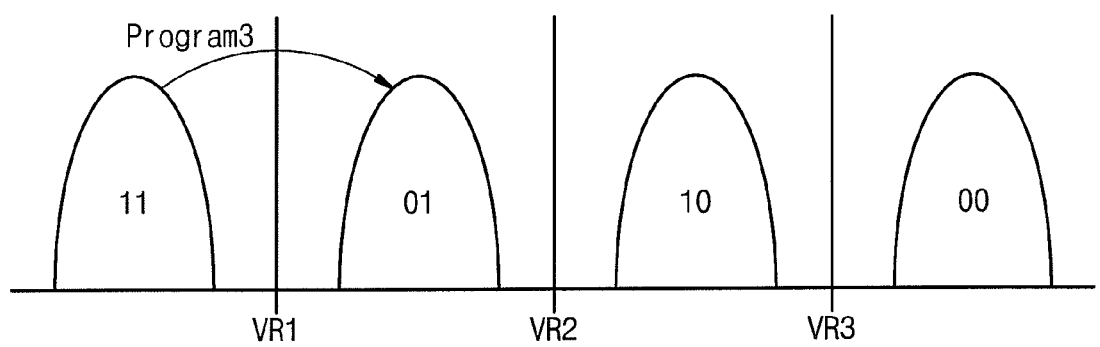

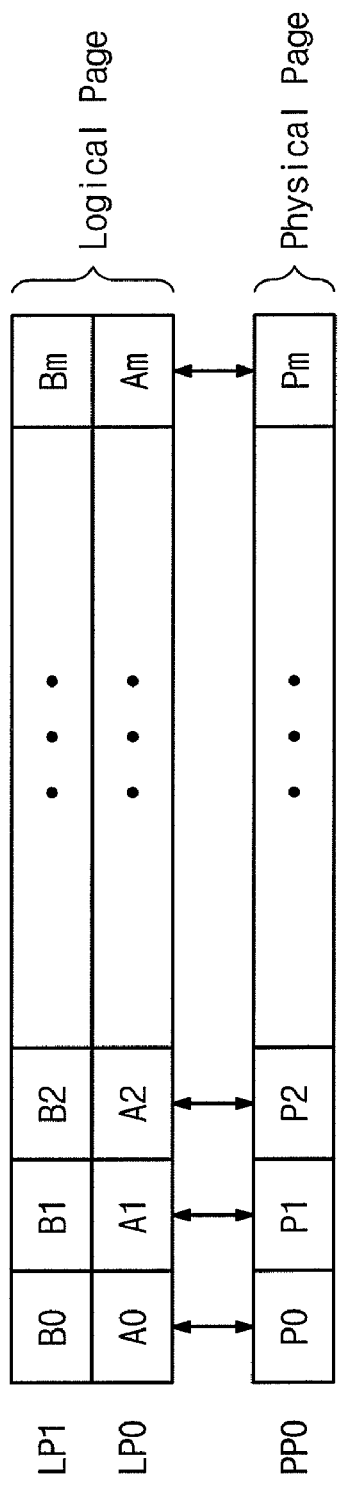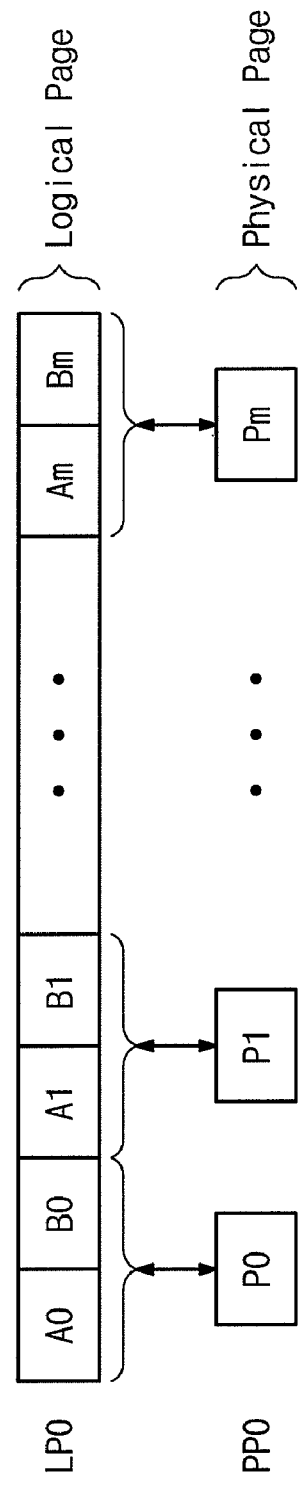

MEMORY SYSTEM INCLUDING MLC FLASH MEMORY

CROSS-REFERENCE TO RELATED APPLICATIONS

This application claims priority under 35 U.S.C. §119 to Korean Patent Application No. 10-2007-0013896, filed on Feb. 9, 2007, the entire contents of which are hereby incorporated by reference.

BACKGROUND OF THE INVENTION

1. Technical Field

The present disclosure relates to a memory system, and more particularly, to a memory system including a multi-level cell (MLC) flash memory.

2. Discussion of the Related Art

Recently, the use of non-volatile memory in devices has increased. For example, MP3 players, digital cameras, mobile phones, camcorders, flash cards, and solid state disks use non-volatile memory as a storage device.

Similarly, there is a need for non-volatile memory with increased storage capacity. One method for increasing storage capacity is to use a multi-level cell (MLC) that stores a plurality of bits in one memory cell.

FIG. 1 is a block diagram of a conventional memory system. Referring to FIG. 1, a conventional memory system 100 includes a host 110, a memory controller 120, and a flash memory 130.

The memory controller 120 includes a buffer memory 121. The flash memory 130 includes a cell array 131 and a page buffer 132. Although not illustrated in FIG. 1, the flash memory 130 also includes a decoder, a data buffer, and a control unit.

The memory controller 120 receives data and a write command from the host 110, and the memory controller 120 controls the flash memory 130 to write the data in the cell array 131. Additionally, the memory controller 120 controls the flash memory 130 to read the data stored in the cell array 131 according to a read command inputted from the host 110.

The buffer memory 121 temporarily stores the data used for the flash memory 130 or the data read from the flash memory 130. The buffer memory 121 transmits the data that are temporarily stored by the control of the memory controller 120 into the host 110 or the flash memory 130.

The cell array 131 of the flash memory 130 includes a plurality of memory cells. The memory cells are non-volatile and thus retain their data when no power is applied. The page buffer 132 is a buffer for storing the data that is used for a selected page of the cell array or the data read from the selected page.

Each memory cell of the flash memory 130 is divided into a single level cell (SLC) and an MLC according to the number of data bits that can be stored. The SLC stores a single data bit and the MLC stores multi-bit data.

The SLC stores one bit in one memory cell. The SLC has two states according to the threshold voltage distribution. The memory cell stores either data 1 or data 0 after programming. Here, a memory cell storing the data 1 is in an erase state, and a memory cell storing the data 0 is in a program state. The cell in the erase state may be called an on cell and the cell in the program state may be called an off cell.

The flash memory 130 performs a program operation a page at a time. The memory controller 120 uses the buffer memory 121 therein to transmit the data into the flash memory 130 a page at a time during a program operation.

The page buffer 132 temporarily stores the data loaded from the buffer memory 121, and simultaneously programs the loaded data into a selected page. After completing a program, a program verify operation is performed to verify whether the data has been correctly programmed.

After the program verify operation, when program fail occurs, a program voltage increases and a program operation and a program verify operation are performed again. After programming the data in one page is completed using this method, the next data is received to perform a program operation.

The MLC stores multi-bit data in one memory cell. FIGS. 2 and 3 are views illustrating a process of programming a least significant bit (LSB) and a most significant bit (MSB), e.g., 2 bits, in one memory cell.

Referring to FIG. 2, the memory cell is programmed to have one state selected from the group consisting of four states 11, 01, 10, and 00 according to the threshold voltage distribution. A process of programming the LSB is identical to that of the SLC. The memory cell having a state 11 is programmed to have a dotted line state A depending upon the LSB data.

Next, the memory controller 120 transmits data of one page in the buffer memory 121 into the flash memory 130 for programming. Referring to FIG. 2, the memory cell having a dotted line state A is programmed according to program 1 to have a state 00, or programmed according to program 2 to have a state 10 depending upon the MSB. The memory cell having a state 11 maintains a state 11 or is programmed according to program 3 to have a state 01 depending upon the MSB.

Referring to FIG. 3, the memory cell is programmed to have one of four states 11, 01, 10, and 00 according to the distribution of the threshold voltage. First, the memory cell having a state 11 maintains a state 11 or is programmed according to program 1 to have a state 10 depending upon the LSB. Next the MSB is programmed. The memory cell having a state 10 maintains a state 10 or is programmed according to program 2 to have a state 00 depending upon the MSB. Moreover, the memory cell having a state 11 maintains a state 11 or is programmed according to program 3 to have a state 01 depending upon the MSB.

Referring to FIG. 1 again, the memory system 100 programs the multi-bit data into the cell array 131 of the flash memory 130 by using the same method. The LSB is programmed first and then the MSB is programmed on the memory cell where the LSB is programmed.

The conventional memory system 100 allocates two logical pages in one physical page. Here, the physical page is a group of memory cells connected to one word line. When 2 bit data is stored in the one memory cell, the flash memory 130 reads or programs the LSB and MSB, respectively. One physical page has two logical pages. The pages logically existing in one physical page are called logical pages.

After the LSB is programmed in one physical page, the MSB is programmed on the same physical page. In programming the LSB, a program speed is relatively fast, but in programming the MSB, a program speed is relatively slow.

When more than two logical pages are allocated into one physical page and thus there is one or more logical pages between the LSB logical page and the MSB logical page, the program speed becomes slower as the logical pages being programmed are closer to the MSB logical page. As the logical pages being programmed approach the MSB, the possibility of data error occurrence increases. Accordingly, the LSB has a relatively high reliability but the MSB has a relatively low reliability. For this reason, the reliability of logical pages allocated in one physical page varies according to the LSB and MSB.

To enhance data reliability, error correction code (ECC) or a channel coding technique can be used. However, when a plurality of logical pages are allocated into one physical page, data error possibility varies according to each of the logical pages. Therefore, there is a limit in applying the ECC or the channel coding technique.

SUMMARY OF THE INVENTION

Exemplary embodiments of the present invention provide a multi-level cell memory system allocating one logical page in one physical page.

Exemplary embodiments of the present invention provide memory systems including a flash memory storing multi-bit data in one memory cell. A memory controller controls the flash memory to program the multi-bit data in the memory cell. The flash memory programs the multi-bit data in the memory cell by using an identical program operation.

In some exemplary embodiments, the flash memory includes a cell array having a plurality of memory cells. A page buffer unit has a plurality of page buffers to program each of the memory cells or to store data read from each of the memory cells. A data buffer unit has a plurality of data buffers to receive the multi-bit data from the memory controller and provide the inputted data into each of the page buffers.

In some exemplary embodiments, the data buffers corresponding to the number of bits programmed in one memory cell are connected to one page buffer. The multi-bit data are inputted into the data buffers connected to the one page buffer.

In some exemplary embodiments, the flash memory stores an LSB (least significant bit) and an MSB (most significant bit) in one memory cell. The LSB and the MSB are inputted into the data buffer unit simultaneously or nearly simultaneously. The flash memory programs 2-bit data in the memory cell according to the LSB and the MSB inputted into the data buffer unit. The flash memory simultaneously, or nearly simultaneously, reads the 2-bit data programmed in the memory cell.

In some exemplary embodiments, the flash memory and the memory controller are integrated in one memory card. The flash memory is an NAND flash memory.

In some exemplary embodiments of the present invention, memory systems include a flash memory storing a plurality of logical page data in one physical page. A memory controller controls the flash memory to program the plurality of logical page data in the one physical page. The flash memory programs the plurality of logical page data in the one physical page by using an identical program operation.

In some exemplary embodiments, the flash memory includes a cell array having a plurality of memory cells. A page buffer unit has a plurality of page buffers to program each of the memory cells or to store data read from each of the memory cells. A data buffer unit has a plurality of data buffers to receive the multi-bit data from the memory controller and provide the inputted data into each of the page buffers.

In some exemplary embodiments, the data buffers corresponding to the number of bits programmed in one memory cell are connected to one page buffer. The plurality of logical page data are inputted into the data buffers connected to the one page buffer.

In other exemplary embodiments, the flash memory stores an LSB and an MSB in one memory cell. The LSB and the MSB are inputted into the data buffer unit simultaneously or nearly simultaneously. The flash memory programs 2-bit data in the memory cell according to the LSB and the MSB inputted into the data buffer unit. The flash memory simultaneously, or nearly simultaneously, reads 2-bit data programmed in the memory cell.

BRIEF DESCRIPTION OF THE DRAWINGS

The accompanying figures provide a further understanding of the exemplary embodiments of the present invention. In the figures:

FIGS. 2 and 3 are diagrams showing multi-bit data programmed into one memory cell;

FIGS. 5 and 6 show a page allocating method in a system according to an exemplary embodiment of the present invention;

DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the exemplary embodiments set forth herein.

Figure 4:
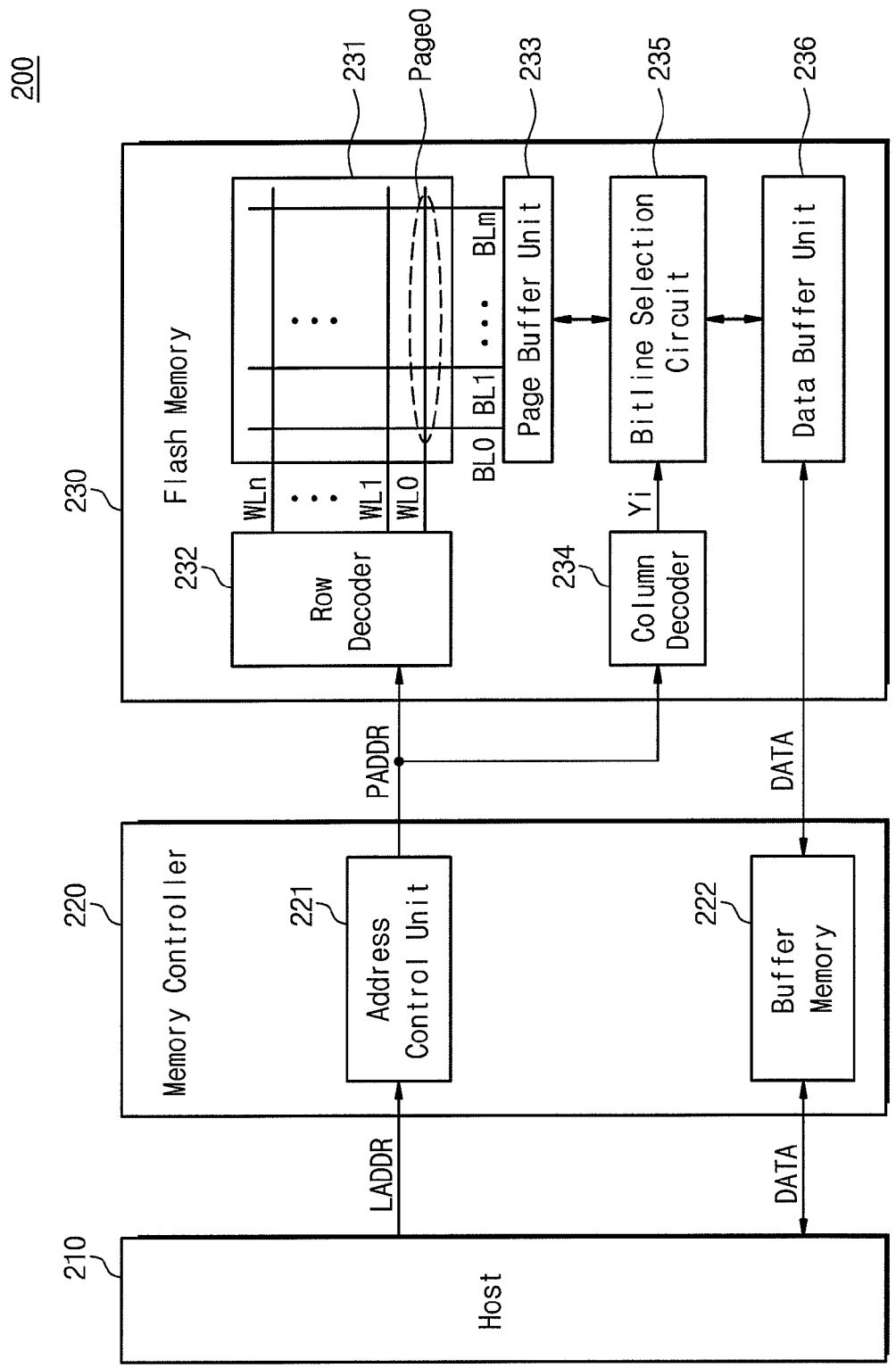
FIG. 4 is a block diagram of a memory system according to an exemplary embodiment of the present invention.

FIG. 4 is a block diagram of a memory system according to an exemplary embodiment of the present invention. Referring to FIG. 4, a memory system 200 includes a host 210, a memory controller 220, and a flash memory 230. The flash memory 230 may store multi-bit data in one memory cell.

Referring to FIG. 4, the memory controller 220 and the flash memory 230 may be included in one memory card. Examples of memory cards include a multi-media card (MMC), an SD card, an xD card, a CF card, and a SIM card. Additionally, these memory cards are connected to and used in the host 210, for example, a desktop computer, a notebook computer, a digital camera, a mobile phone, an MP3 player, and a personal media player (PMP).

The memory controller 220 controls general operations (e.g., write or read operation) of the flash memory 230. Referring to FIG. 4, the memory controller 220 includes an address control unit 221 and a buffer memory 222.

An address control unit 221 receives a logical address LADDR from the host 210. The address control unit 221 converts the inputted logical address LADDR into a physical address PADDR. The physical address PADDR is provided into the flash memory 230.

The buffer memory 222 temporarily stores the data that will be used in the flash memory 230 or the data read from the flash memory 230. The data stored in the buffer memory 222 is transmitted into the flash memory 230 or the host 210. The buffer memory 222 may be embodied using a random access memory (RAM) such as SRAM and DRAM.

Referring to FIG. 4, the flash memory 230 includes a cell array 231, a row decoder 232, a page buffer unit 233, a column decoder 234, a bit line selection circuit 235, and a data buffer unit 236. In FIG. 4, a NAND flash memory is used as the flash memory 230.

The cell array 231 includes a plurality of memory blocks (not shown). Each memory block includes a plurality of pages (e.g., 32 pages, 64 pages, etc.). Each page includes a plurality of memory cells (e.g., 512 B, 2 KB, etc.) sharing one word line WL. In a NAND flash memory, an erase operation is performed by a memory block unit, and read and write operations are performed by a page unit.

Figure 1:
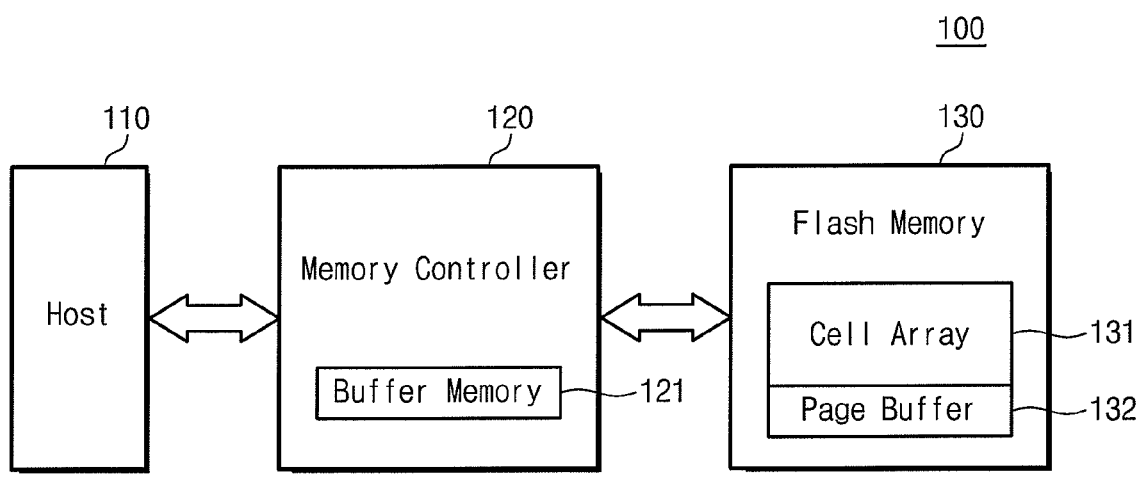
FIG. 1 is a block diagram of a conventional memory system.
Figure 3:
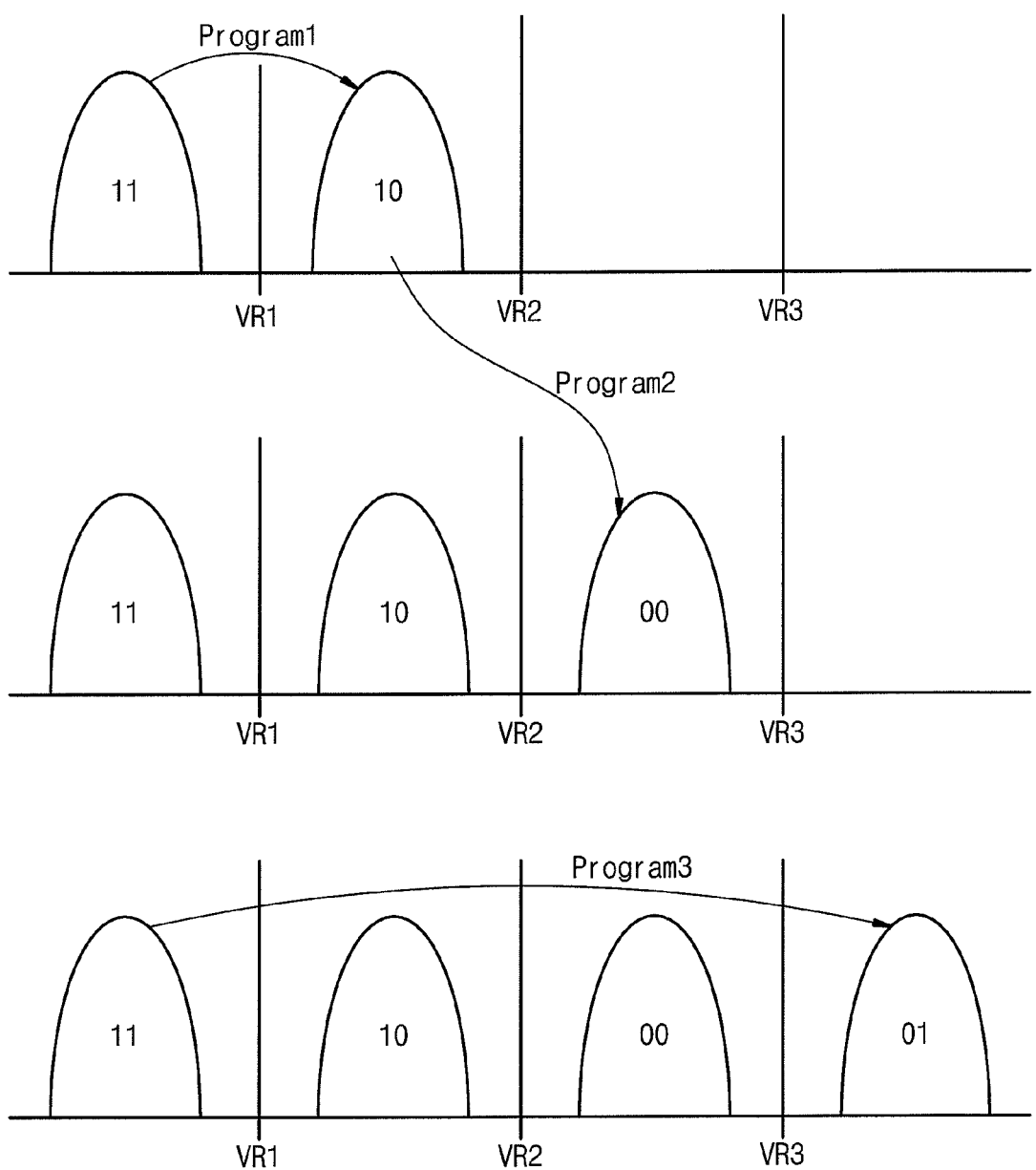

Referring to FIGS. 2 and 3, when 2-bit data are stored in one memory cell, each memory cell has four states or levels according to the threshold voltage distribution. Hereinafter, a case of one multi level cell having 2-bit data will be described. However, exemplary embodiments of the present invention can be applied to a case of one multi level cell having more than 2-bit data (e.g., 3 bit, 4 bit, etc.).

The row decoder 232 is connected to the cell array 231 through word lines WL0 to WLn. The row decoder 232 receives a physical address PADDR from the address control unit 221 of the memory controller 220, and selects one word line (e.g., WL0). A bias voltage is applied to the select word line WL0.

The page buffer unit 233 is connected to the cell array 231 through bit lines BL0 to BLm. The page buffer unit 233 includes a plurality of page buffers (not shown), and each page buffer stores the data loaded from the buffer memory 222. The loaded data are simultaneously, or nearly simultaneously, programmed into the selected page (e.g., page 0) during a program operation. The page buffer unit 233 reads data from the selected page, page 0, during a read operation and temporarily stores the read data. The data stored in the page buffer unit 233 is transferred into the buffer memory 222 in response to a read enable signal nRE (not shown).

The column decoder 234 receives a physical address PADDR from the address control unit 221 of the memory controller 220, and generates a select signal Yi. The select signal Yi is provided into the bit line selection circuit 235. The column decoder 234 receives a column address CA, and the row decoder 232 receives a row address RA.

The bit line selection circuit 235 selects a bit line in response to the select signal Yi. The bit line selection circuit 235 includes MOS transistors that are turned on or off according to the select signal Yi.

The data buffer unit 236 includes a plurality of data buffers (not shown). The plurality of data buffers are input/output buffers used for data transmission between the memory controller 220 and the flash memory 230. The data buffer unit 236 is electrically connected to the page buffer 233 through the bit line selection circuit 235. The connection relationship between the data buffer unit 236 and the page buffer unit 233 will be described in more detail with reference to FIGS. 6 and 7.

A conventional memory system allocates a plurality of logical pages in one physical page, page 0. FIG. 5 is a conceptual view of a page allocating method in a system according to an exemplary embodiment of the present invention. Referring to FIG. 5, one physical page PP0 includes a plurality of memory cell P0 to Pm. Two logical pages LP0 and LP1 are allocated in one physical page PP0.

According to the conventional memory system, the memory controller provides low logical page LP0, i.e., low bit data A0, A1, A2, . . . , Am, as a data buffer of the flash memory. The flash memory programs the low bit data A0, A1, A2, . . . , Am into the physical page PP0. Next, the memory controller programs a high logical page LP1, i.e., high bit data B0, B1, B2, . . . , Bm into the same physical page PP0.

Like a conventional memory system, when more than two logical pages are allocated into one physical page, a program speed decreases as approaching higher bit. Moreover, the probability of encountering a data error increases. Since the data error probability varies at each logical page, there is a limit in applying an ECC or channel coding technique.

In the memory system 200 of an exemplary embodiment of the present invention, one logical page LP0 is allocated into one physical page PP0. FIG. 6 is a conceptual view of a page allocating method in a system according to an exemplary embodiment of the present invention. Referring to FIG. 6, one logical page LP0 is allocated into one physical page PP0.

According to the memory system 200 of an exemplary embodiment of the present invention, the memory controller 220 provides low bit and high bit data A0, B0, A1, B1, . . . , Am, Bm stored in the buffer memory 222 into the data buffer unit 236 of the flash memory 230. The flash memory 230 programs the low bit and high bit data A0, B0, A1, B1, . . . , Am, Bm into the physical page PP0. Here, the data A0 and B0 are programmed into the memory cell P0, and the data A1 and B1 are programmed into the memory cell P1. The data Am and Bm are programmed into the memory cell Pm. The operation of the flash memory 230 will be described in more detail with reference to FIG. 7.

Figure 7:
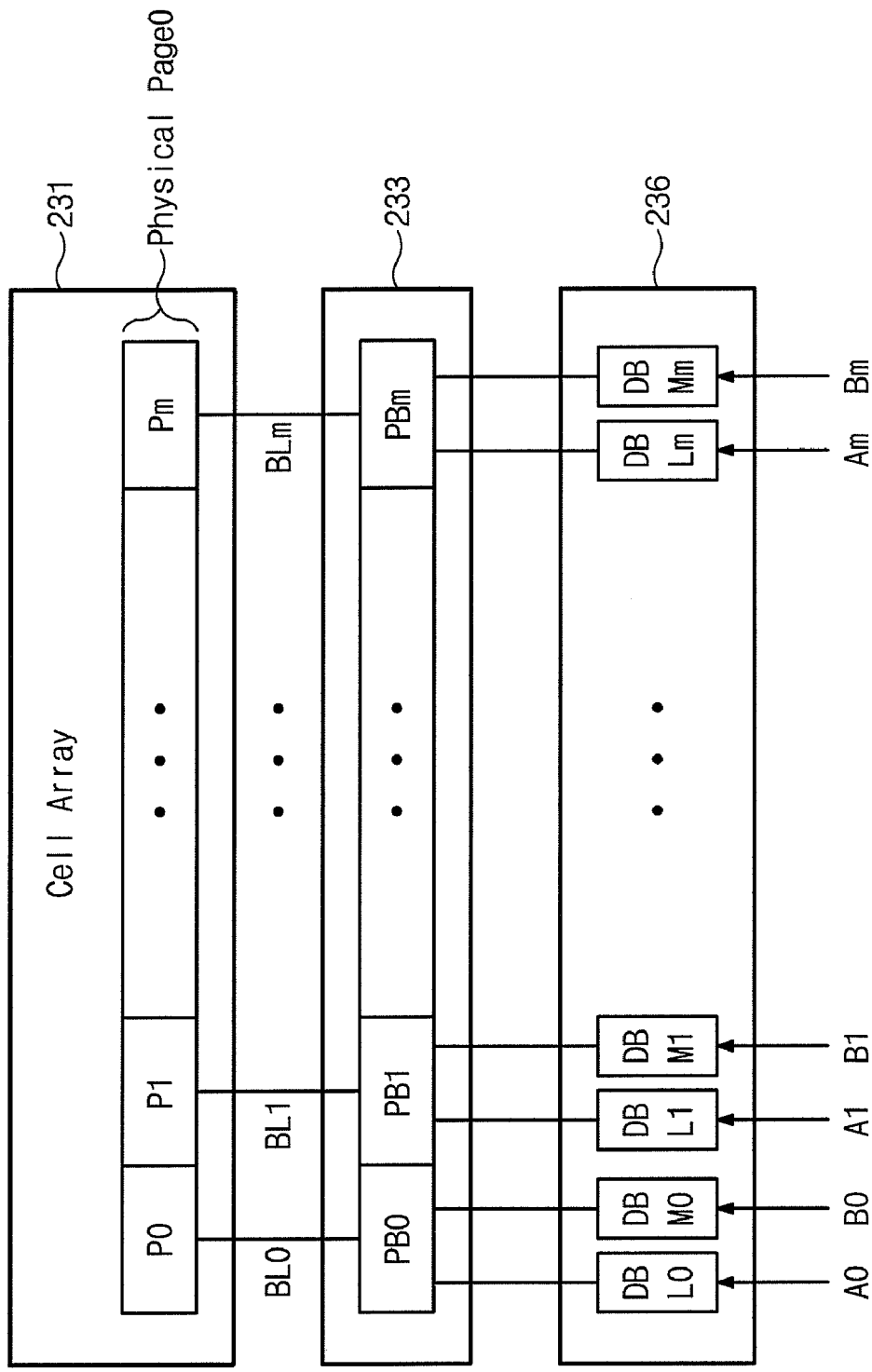
FIG. 7 is a block diagram of a memory system using a page allocating method.

FIG. 7 is a block diagram illustrating a select page, page 0, a page buffer unit 233, and a data buffer unit 236 in the flash memory 230 of FIG 4. One memory cell (e.g., P0) is connected to one page buffer PB0 through the bit line B0. The one page buffer PB0 is connected to two data buffer DB_L0, and DBM0 through the data line. A low bit data A0 is inputted into the data buffer DB_L0, and a high bit data B0 is inputted into the data buffer DB_M0.

The low bit and high bit data A0 and B0 are simultaneously provided into the page buffer PB0. The page buffer PB0 programs the memory cell P0 according to the low bit and high bit data A0 and B0. The memory cell P0 has a threshold voltage of FIGS. 2 and 3 according to the low bit and high bit data A0 and B0.

The memory system 200 allocates one logical page info one physical page. At this point, one physical page and one logical page may have respectively different page sizes. For example, assuming that one memory cell stores 2-bit data, when the size of the logical page is 2 KB, the physical page is 1 KB. In an exemplary embodiment of the present invention, the data of one physical page may be outputted into one logical page rather than a plurality of logical pages. At this point, the size of the logical page is twice the size of the physical page.

According to an exemplary embodiment of the present invention, read and write operational characteristics of one physical page need not change according to the low bit and high bit data. The data stored in one physical page has the same data reliability regardless of the logical page. According to an exemplary embodiment of the present invention, reliability may be enhanced, even when approaching a higher bit. This will be described in more detail with reference to FIGS. 8 and 9.

Figure 8:
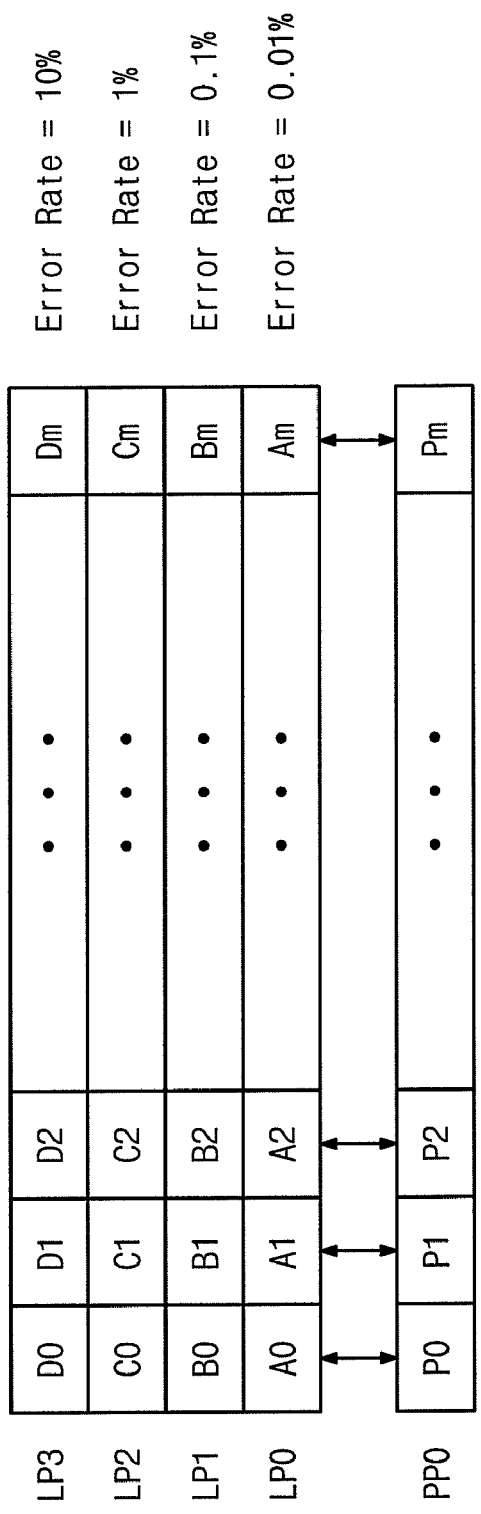
FIGS. 8 and 9 show a page allocating method in a memory system according to an exemplary embodiment of the present invention.
Figure 9:
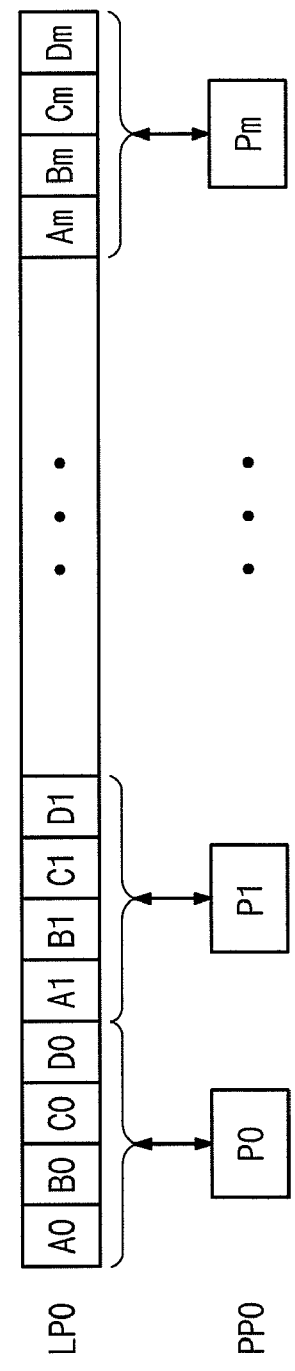

FIGS. 8 and 9 are views of a page allocating method of a flash memory storing 4-bit data in one memory cell. FIG. 8 is a conceptual views a conventional page allocating method of a memory system. Referring to FIG. 8, four logical pages LP0, LP1, LP2, and LP3 are allocated in one physical page PP0.

According to the conventional memory system, the low bit data A0, A1, A2, . . . , Am are programmed into the physical page PP0, and then the high bit data B0, B1, B2, . . . , Bm are programmed into the same page PP0. Next, high bit data C0, C1, C2, . . . , Cm and D0, D1, D2, . . . , Dm are sequentially programmed into the same page PP0.

Referring to FIG. 8, the error occurrence possibility of the logical page LP0 is 0.01%, and the error occurrence possibility of the logical page LP1 is 0.1%. The error occurrence possibility of the logical page LP3 is 1%, and the error occurrence possibility of the logical page LP3 is 10%. That is, when approaching a higher bit, the error occurrence possibility increases by approximately 10 times. Moreover, when approaching a higher bit, the program speed decreases. The logical pages LP0, LP1, LP2, and LP3 have respectively different characteristics.

A conventional memory system uses an ECC or a channel coding technique to resolve the data reliability problem between logical pages or discordance problem of program characteristics. However, the ECC or the channel coding technique needs to be manufactured by considering a logical page LP3 having the worst characteristics for the above problems. As the number of data stored in one memory cell increases, the design of the memory system becomes more difficult.

FIG. 9 is a conceptual view of a page allocating method in a memory system. Referring to FIG. 9, one logical page LP0 is allocated into one physical page PP0.

According to an exemplary embodiment of the present invention, the low bit and high bit data A0, B0, C0, D0, A1, B1, C1, D1, ..., Am, Bm, Cm, Dm are programmed into one physical page PP0. Here, the data A0, B0, C0, D0 are programmed into one physical memory cell P0, and the data A1, B1, C1, D1 are programmed into one physical memory cell P1. The data Am, Bm, Cm, Dm are programmed into the memory cell Pm. To perform a page allocating method of FIG. 9, four data buffer are connected to one page buffer.

The memory system of an exemplary embodiment of the present invention allocates one logical page into one physical page. According to an exemplary embodiment the present invention, although the number of data bits that is programmed in one memory cell increases, data reliability is uniformly maintained regardless of the logical page. Accordingly, data reliability is enhanced, and an ECC or a channel coding technique can be easily applied.

Moreover, in a conventional memory system, when fail occurs in one memory cell, it is identical to the situation of when fail occurs in a plurality of logical pages. In this case, an operation for data backup or restoration can be difficult. In exemplary embodiments of the present invention, since the data outputted from one physical page is logically allocated in the same page, only one page needs to be changed. Accordingly, data management is more versatile compared to conventional memory system.

The flash memory of an exemplary embodiment of the present invention and the memory system including the same allocates one logical page into one physical page. However, an exemplary embodiment of the present invention can achieve the result that a plurality of logical pages is allocated in one physical page. According to an exemplary embodiment of the present invention, as the number of data bits programmed in one memory cell increases, the data reliability is enhanced.

The above-disclosed subject matter is to be considered illustrative, and not restrictive. It should be understood that various changes, substitutions and alterations may be made herein without departing from the scope of the present invention.

What is claimed is:

1. A memory system comprising:
a flash memory storing multi-bit data including at least first bit data and second bit data in one memory cell; and
a memory controller controlling the flash memory to program the multi-bit data in the one memory cell at the same time;
wherein the memory system allocates only one logical page into one physical page and wherein one physical page and one logical page have respectively different page sizes.

2. The memory system of claim 1, wherein the flash memory comprises:
a cell array having a plurality of memory cells;
a page buffer unit having a plurality of page buffers to program each of the plurality of memory cells or to store data read from each of the plurality of memory cells; and
a data buffer unit having a plurality of data buffers to receive the multi-bit data from the memory controller, the data buffer unit providing the inputted data into each of the plurality of page buffers.

3. The memory system of claim 2, wherein data buffers of the plurality of data buffers, corresponding to the number of bits programmed in a memory cell of the plurality of memory cells, are connected to a page buffer of the plurality of page buffers.

4. The memory system of claim 3, wherein the multi-bit data are inputted into the data buffers connected to the one page buffer.

5. The memory system of claim 2, wherein the flash memory stores an LSB (least significant bit) and an MSB (most significant bit) in the one memory cell.

6. The memory system of claim 5, wherein the LSB and the MSB are inputted into the data buffer unit substantially simultaneously.

7. The memory system of claim 6, wherein the flash memory programs 2-bit data in the one memory cell according to the LSB and the MSB inputted into the data buffer unit.

8. The memory system of claim 7, wherein the flash memory substantially simultaneously reads the 2-bit data programmed in the memory cell.

9. The memory system of claim 1, wherein the flash memory and the memory controller are integrated in one memory card.

10. The memory system of claim 1, wherein the flash memory is an NAND flash memory.

11. The memory system of claim 1, wherein the second bit data is programmed into the physical page while the first bit data is programmed into the physical page.

* * * * *